(12) United States Patent
Vallet et al.

(10) Patent No.: US 11,437,985 B1
(45) Date of Patent: Sep. 6, 2022

(54) DUTY CYCLE CORRECTION CIRCUIT

(71) Applicant: NXP USA, Inc., Austin, TX (US)

(72) Inventors: Mathieu Vallet, Cannes (FR); Stefano Dal Toso, Antibes (FR); Mathieu Périn, Cairon (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/449,740

(22) Filed: Oct. 1, 2021

(30) Foreign Application Priority Data

Mar. 30, 2021 (EP) .................................. 21305402

(51) Int. Cl.
| | |
|---|---|
| *H03K 21/00* | (2006.01) |
| *H03K 5/156* | (2006.01) |
| *H03K 21/10* | (2006.01) |
| *H03K 23/40* | (2006.01) |

(52) U.S. Cl.
CPC .......... *H03K 5/1565* (2013.01); *H03K 21/10* (2013.01); *H03K 23/40* (2013.01)

(58) Field of Classification Search
None
See application file for complete search history.

(56) References Cited

U.S. PATENT DOCUMENTS

| | | | |
|---|---|---|---|
| 6,404,839 B1 * | 6/2002 | Fong | ...................... H03K 21/10 377/80 |
| 7,259,604 B2 | 8/2007 | Gomm | |
| 8,406,371 B1 | 3/2013 | Barale et al. | |
| 9,270,280 B1 * | 2/2016 | Margarit | .............. H03K 23/667 |
| 9,543,960 B1 * | 1/2017 | He | .................. H03K 21/10 |
| 9,608,801 B2 | 3/2017 | Perdoor et al. | |
| 10,348,316 B2 * | 7/2019 | Matsuda | .............. H03K 23/486 |
| 2014/0275363 A1 * | 9/2014 | Iijima | .................... C08G 77/04 524/99 |

* cited by examiner

Primary Examiner — Tuan T Lam

(57) ABSTRACT

A duty cycle correction circuit (DCCC) for a multi-modulus frequency divider, the DCCC comprising: a corrector chain comprising a plurality of flip-flops each configured to receive one of the internal signals; and at least one delay selection logic element, each configured to receive an output signal from different ones of the flip-flops and the output of each delay selection logic element is based on the received output signal and the division factor; the DCCC is configured such that: a first state change in its output signal is defined by a transition to a first logic state of one of the internal signals; and a second state change in its output signal is based on a transition to a second logic state of one of the internal signals after a delay period, wherein the duty cycle of the output signal is based on the delay period.

15 Claims, 8 Drawing Sheets

DUTY CYCLE CORRECTION CIRCUIT

CROSS-REFERENCE TO RELATED APPLICATIONS

This application claims the priority under 35 U.S.C. § 119 of European Patent application no. 21305402.6, filed on 30 Mar. 2021, the contents of which are incorporated by reference herein.

FIELD

The present disclosure relates to a duty cycle correction circuit and a phase locked loop comprising the same.

SUMMARY

According to a first aspect of the present disclosure there is provided a duty cycle correction circuit for a multi-modulus frequency divider, the multi-modulus frequency divider comprising a chain of divide by ⅔ prescalers wherein a division factor defines a mode of operation of each of the divide by ⅔ prescalers and wherein the duty cycle correction circuit is configured to provide an output signal based on: a plurality of internal signals comprising frequency divided signals received from the multi-modulus frequency divider; and the division factor,
  the duty cycle correction circuit comprising:
    a corrector chain comprising a plurality of flip-flops, each flip-flop configured to receive a respective one of the plurality of internal signals from the multi-modulus frequency divider; and
    at least one delay selection logic element, each delay selection logic element configured to receive an output signal from different ones of the flip-flops and the output of each delay selection logic element is based on the received output signal from the one of the flip flops and the division factor;
    wherein the duty cycle correction circuit is configured such that:
    a first state change in the output signal of the duty cycle correction circuit is defined by a transition to a first logic state of one of the plurality of internal signals received from a selected prescaler of the multi-modulus frequency divider; and
    a second state change in the output signal of the duty cycle correction circuit is based on a transition to a second logic state of one of the plurality of internal signals after a delay period, wherein the duty cycle of the output signal is based on the delay period and wherein each flip-flop in the corrector chain sequentially imparts a delay to a signal moving through the flip flops based on the internal signal received by the flip-flop of the plurality of internal signals, wherein the delay period comprises the sum of the delays imparted by the flip-flops and wherein the delay selection logic elements are configured such that they define the end of the delay period by selecting the output of one of the flip-flops based on the division factor.

In one or more embodiments, the duty cycle correction circuit may further comprise the multi-modulus frequency divider comprising the chain of divide by ⅔ prescalers and wherein the multi-modulus frequency divider is configured to provide the plurality of internal signals to the duty cycle correction circuit.

In one or more embodiments, the transition to a second logic state of one of the plurality of internal signals may be a transition to a second logic state of a signal derived from a prescaler preceding the selected prescaler in the chain of prescalers.

In one or more embodiments, each of the flip-flops in the corrector chain may be configured to provide an output signal based on the receipt of:
  a signal in a first logic state from a preceding flip-flop in the corrector chain; and
  a state change of the internal signal received by the flip-flop from the plurality of internal signals,
such that each flip-flop in the chain of flip-flops adds to the delay period.

In one or more embodiments, the corrector chain may comprise a first sub-chain comprising one or more flip-flops that is configured to impart a first sub-delay based on the internal signals received from the selected divide by ⅔ prescaler and a second sub-chain comprising one or more flip-flops configured to impart a second sub-delay based on the internal signals received from a second divide by ⅔ prescaler wherein the second divide by ⅔ prescaler precedes the selected divide by ⅔ prescaler in the chain of divide by ⅔ prescalers, wherein the first sub-chain is separated from the second sub-delay chain by a chain connector logic element and wherein the delay period is comprised of the first sub-delay and the second sub-delay.

In one or more embodiments, the arrangement of flip-flops and delay selection logic elements may be such that the duty cycle of the output signal of the duty cycle correction circuit is between 40-60%.

In one or more embodiments, the arrangement of flip-flops and delay selection logic elements may be such that the duty cycle of the output signal of the duty cycle correction circuit is between 45-55%.

In one or more embodiments, the arrangement of flip-flops and delay selection logic elements may be such that the duty cycle of the output signal of the duty cycle correction circuit is between 48-52%.

In one or more embodiments, the arrangement of flip-flops and delay selection logic elements may be such that the duty cycle of the output signal of the duty cycle correction circuit is substantially 50%.

In one or more embodiments:
  the first divide by ⅔ prescaler in the chain of divide by ⅔ prescalers may be configured to receive a digital input signal and provide an output signal based on the digital input signal and the division factor; and
  each subsequent divide by ⅔ prescaler in the chain of divide by ⅔ prescalers may be configured to receive an output signal of a preceding prescaler in the chain of divide by ⅔ prescalers and wherein the output of each subsequent divide by ⅔ prescaler is based on the output signal of the preceding prescaler and the division factor.

In one or more embodiments, the division factor may be a digital word comprising a plurality of division values and wherein each division value is a digital value and is provided to a different one of the divide by ⅔ prescalers to control whether the prescaler is operating in a divide-by-2 mode or a divide-by-3 mode and wherein each delay selection logic element of the duty cycle correction circuit is configured to receive at least one of the division values and the delay selection logic elements are configured to control the delay period by selecting which flip-flop output signal in the chain of flip flops to use for triggering the second state change in the output signal of the duty cycle correction circuit.

In one or more embodiments, a change of state may be an output signal of the corrector chain, which is based on the transition to a second logic state of one of the plurality of internal signals, causes the second state change of the output signal of the duty cycle correction circuit.

In one or more embodiments, one or more of: the plurality of internal signals provided to the flip-flops; the connections of the delay selection logic elements; and the division factor may be reconfigurable such that the delay period is adjustable.

In one or more embodiments, the duty cycle correction circuit of claim 13 may further comprise:
 a memory that stores a plurality of duty cycle profiles, each duty cycle profile defining the interconnection of signals, delay selection logic elements and the division factor needed to provide a different current consumption of the duty cycle correction circuit and duty cycle of the output signal of the duty cycle correction circuit; and
 a controller configured to receive signalling indicative of a user selection of one or both of a desired current consumption and a desired duty cycle and the controller further configured to control one or more of:
  the internal signals provided to the flip-flops;
  the connections of the delay selection logic elements; and
  the division factor,
wherein the controller is configured to select a duty cycle profile based on the received signalling and control the connection of the internal signals to the flip-flop, the connections of the delay selection logic elements and the division factor in order to achieved desired one or both of current consumption and duty cycle.

According to a second aspect of the present disclosure, there is disclosed a phase locked loop comprising the duty cycle control circuit of any preceding claim.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

A frequency divider is configured to receive an input signal and provide an output signal at a reduced frequency. A frequency divider is generally comprised of a plurality of individual prescalers arranged such that each performs a division on a signal received at its input. In this way, the division of the input signal to the frequency divider can be controlled by adjusting the number of prescalers in the chain. As a result of this, frequency dividers can be used in a plurality of systems such as PLLs, digital clock generators and for the management of several clock sources with different frequencies to a unique output frequency.

A multi-modulus frequency divider is a specific type of frequency divider composed of a plurality of prescalers which can selectively adjust the division they apply to an incoming signal. In the case of a divide by ⅔ prescaler, for example, the first frequency division of a received signal over a division period can selectively be a division by either 2 or 3. The selection of the division by either 2 or 3 can be selected based on a received division value which may be a digital input signal, i.e., a digital value. Taken together, the division values for each of the prescalers in a multi-modulus frequency divider may be referred to as a division factor and may form a digital word.

Typical multi-modulus frequency dividers output a clock signal which has a non-50% duty cycle which depends on a selected division factor. In some applications, both the rising and falling edges of the output clock can be used in the wider circuit, thereby requiring a carefully controlled duty cycle. In some high-frequency or lower-power digital systems, the timings (setup and hold violations) can become critical, requiring a duty cycle close to 50% to importantly avoid variation of rising to falling edges and vice versa.

For example, in PLL systems, a feedback clock is used to control the digital part of the PLL (such as the sigma-delta modulator) and can require a duty cycle of close to 50%. If the duty cycle is not at, or not substantially at, 50%, the signal may be seen by the system to be a higher working frequency, thereby leading to more risks and less margin for error in the digital part of the PLL, such as in a sigma-delta modulator of the PLL. The duty cycle correction circuit of the present disclosure may provide for an increase in the robustness of the duty cycle for maintaining a desired duty cycle as well as reduce the current consumption of the system while only needing to use signals to define the duty cycle that are internal to the multi-modulus frequency divider. Overall, the duty cycle correction circuit may be configured to set the duty cycle of its output signal either to a desired value or to within an acceptable range of a desired value using internal signals of a multi-modulus frequency divider.

Figure 1:
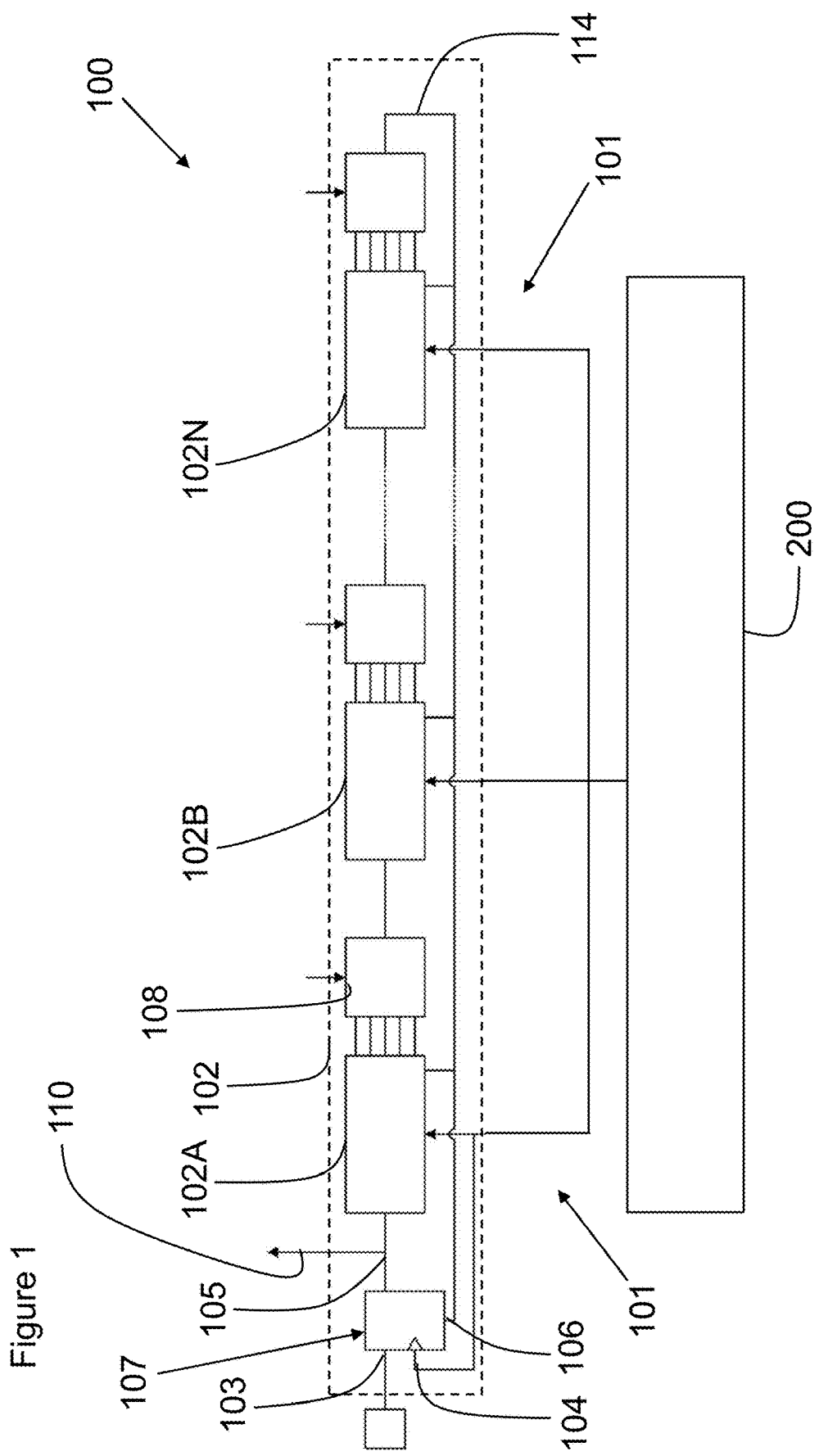
FIG. 1 shows an example duty cycle correction circuit.

FIG. 1 shows an example embodiment of a duty cycle correction circuit 100. In this embodiment, the duty cycle correction circuit 100 receives a plurality of internal signals 101 from a multi-modulus frequency divider 200, wherein the internal signals 101 are internal to the multi-modulus frequency divider 200. The multi-modulus frequency divider 200 comprises a plurality of prescalers in a chain arrangement and the internal signals 101 comprise the inputs and outputs of those prescalers. While the multi-modulus frequency divider 200 is shown in the example of FIG. 1 as a separate unit or circuit to the duty cycle correction circuit 100, in one or more other embodiments, the multi-modulus frequency divider 200 may be part of the duty cycle correction circuit 100.

The duty cycle correction circuit 100 comprises a corrector chain 102 that comprises a plurality of flip-flops 103 arranged in a chain such that, apart from for the first flip-flop in the chain, an input of each flip-flop is coupled to an output of the preceding flip-flop in the chain. Each flip-flop is configured to receive at least one of the internal signals 101 of the multi-modulus frequency divider 200. In this form, each flip-flop acts as a digital latch where, if the signals at both of its first input 103 and second input 104 match a predetermined condition (such as both inputs being logic high or logic "1", for example), the flip-flop will latch on and provide a constant output signal (such as logic high) at its output terminal 105 until a reset signal is received by the flip-flop at a reset terminal 106. It will be appreciated herein that, while logic high or logic 1 may be used as an example for a received or an output signal, this may equally be a logic low or logic 0 state. Because the flip-flops of the corrector chain 102 are arranged in a chain, each flip-flop in the corrector chain 102 will not be latched on until the preceding flip-flop in the chain 102 has been latched on and, after the latching of the preceding flip-flop occurs, an appropriate signal or state change of an internal signal is received at the second input of the flip-flop. Because of the need to wait for an appropriate signal or state change of a signal after the latching of a preceding flip-flop, each flip-flop sequentially imparts a delay in the transmission of a signal through the flip-flops based on the internal signal of the plurality of internal signals of the multi-modulus frequency divider 200 received at the flip-flop's second input terminal. The first flip-flop 107 in the chain of flip-flops may receive an activation signal, which may be a constant signal source or may be a triggering signal, at its first input terminal 103 and receives one of the plurality of internal signals 101 of the multi-modulus frequency divider 200 at its second input terminal 104. As such, the first flip-flop 107, and thereby the corrector chain 102 as a whole, may be either configured to constantly correct the duty cycle of a signal or it may be configured to provide for duty cycle correction when triggered.

As mentioned, each flip-flop may comprises a reset terminal 106 configured such that, when a suitable signal is received (such as a logic high signal), the output of the flip-flop returns to its original state (such as logic state low). A delay output of the corrector chain 102 may be coupled to the reset terminal 106 of one or each of the flip-flops, such that, when a delayed signal is output from the corrector chain 102, each of the flip-flops are returned to their original default state (such as logic low).

Two or more of the flip-flops may be connected to corresponding and different delay selection logic elements 108 such that the output signal of a flip-flop may be coupled to the input of a respective delay selection logic element 108. The delay selection logic elements 108 may be any suitable logic element, or combination of logic elements, such as AND gates, NAND gates, XAND gates, OR gates, NOR gates, XOR gates or any other suitable logic element. The output of the delay selection logic element 108 is based on the received output signal from its respective flip-flop and the division factor. The delay selection logic elements 108 may, together, be configured to select which of the outputs from the corrector chain 102 to use as a delay output signal of the corrector chain 102 in response to the division factor. Each delay selection logic element 108 may be configured such that it provides an output signal under different conditions to each other delay selection logic element 108 where those conditions are based on the division factor. It will be appreciated that the box 108 represents a plurality of delay selection logic elements 108.

For example, consider the case of a first delay selection logic element 108 receiving an output signal from a third flip-flop in the corrector chain 102 and a second delay selection logic element 108 receiving an output signal from a fourth flip-flop in the corrector chain 102. The first delay selection logic element 108 may be configured to provide an output signal when it receives the signal from the third flip-flop and when the logic state of a second value in the division factor is at logic state high. The second delay selection logic element 108 may be configured to provide an output signal when it receives a signal from the fourth flip-flop and when the logic state of the second value in the division factor is at logic state low. In this way, the delayed output signal of the corrector chain can be selected based on the value of the second value in the division factor—if the logic state of the second value is high, then the output signal of the third flip-flop will be provided as the delayed output signal of the corrector chain 102 and if the logic state of the second value in the division factor is low, then the output of the fourth flip-flop will be provided as the delayed output signal of the corrector chain 102. It will be appreciated that, in this example, if the logic state of the second value of the division factor is low, then the delayed output signal will be provided at a later time than if that value was high because the fourth flip-flop in the corrector chain 102 imparts an additional delay to the signal.

In one or more embodiments, the corrector chain 102 may be comprised of a plurality of sub-chains 102A, 102B, 102N of flip-flops wherein each sub-chain 102A, 102B, 102N is configured to impart a sub-delay based on the internal signals received from the prescalers of the multi-modulus frequency divider 200. Each sub-chain 102A, 102B, 102N may be connected to a subsequent sub-chain 102A, 102B, 102N by a chain connector logic element. The chain connector logic element may be any suitable logic element such as an OR gate, a XOR gate, a NOR gate or any other logic element or combination of logic elements that allows an output signal based on the receipt of a signal from one of the delay selection logic elements 108.

For example, the corrector chain 102 may comprise a first sub-chain 102A of flip-flops that is configured to impart a first sub-delay based on the internal signals 101 received from one of the selected prescalers. The corrector chain 102 may further comprise a second sub-chain 102B of flip-flops configured to receive the output of the first-sub chain 102A of flip-flops as its input signal and provide an output signal after a second sub-delay based on the internal signals received from one of the selected prescalers. As shown in FIG. 1, the corrector chain 102 may comprise N sub-chains 102A-102N wherein each sub-chain 102A-102N comprises a plurality of flip-flops configured to receive the output of a preceding sub-chain 102A-102N as its input signal and provide an output signal after an n-th sub-delay based on the internal signals received from one of the selected prescalers. The delay selection logic elements 108 of each sub-chain 102A, 102B, 102N may be configured to select which delay from a plurality of available delays caused by the flip-flops to use as the output signal of each sub-chain 102A, 102B, 102N and each sub-chain 102A, 102B, 102N may be connected to a subsequent sub-chain 102A, 102B, 102N by a chain connector logic element. Each sub-chain 102A, 102B, 102N may be configured to receive one or more internal signals from a single one of the plurality of pre-scalers of the multi-modulus frequency divider 200. The output of the final sub-chain 102A, 102B, 102N may provide the output signal of the corrector chain 102. In embodiments wherein there is only a single chain, i.e., where the is nota plurality of sub-chains 102A, 102B, 102N, the output of the corrector chain 102 will be the output signal selected by the delay selection logic.

The output of the duty cycle correction circuit 100 is configured to change state between a first logic state and a second logic state, such as between logic high and logic low or vice versa. In order to obtain a desired duty cycle, it is necessary to force the signal to undergo a state change at desired points in time. This may involve a first state change followed by a second state change after a delay period which may be a predetermined delay period.

The first state change of the output signal of the duty cycle correction circuit 100 is implemented based on a transition to a first logic state of one of the plurality of internal signals received from a selected prescaler of the multi-modulus frequency divider 200. In one or more embodiments, and as shown in FIG. 1, the first flip-flop 107 in the corrector chain 102 may be configured to receive a signal at its second input terminal 104 wherein the signal received at its second input terminal is one of the plurality of internal signals 101 of the multi-modulus frequency divider 200. When the state of the internal signal 101 received at the second input terminal 104 of the first flip-flop 107 changes to a predetermined state, the output 105 of the first flip-flop 107 will be latched on. In this embodiment, the output of the duty cycle correction circuit 100 may be coupled to the output of the first flip-flop 107 and, as such, the latching on of the first flip-flop 107 will latch the output signal of the duty cycle correction circuit on. In this way, the transition to a first logic state of one of the plurality of internal signals 101 causes the first state change of the output signal of the duty cycle correction circuit 100. It will be appreciated that the output signal 110 of the duty cycle correction circuit does not necessarily have to be coupled to the output of the first flip-flop 107, but that another flip-flop could be used and that there could be one or more other components between the triggering flip-flop and the output of the duty cycle correction circuit 100. It will further be appreciated that where we refer to latching on of the output of the duty cycle correction circuit 100 here, the flip-flop may equally be configured to transition the output into an off state (logic 0).

The second state change of the output signal of the duty cycle correction circuit 100 is based on a transition to a second logic state of one of the plurality of internal signals 101 after a delay period. The second logic state may be the same as the first logic state or it may be different. That is, the transition may be one from logic low to logic high or from logic high to logic low. It will be appreciated, however, that since the transition to a second logic state occurs after a delay period, it will inevitably be a different transition than the one that triggers the first state change.

The duty cycle of the output signal 110 is based on the delay period in that the duty cycle is defined by the ratio of time when the output signal is in a first state (such as an 'on' or logic high state) compared to the whole duration of a single period, i.e., the time from a given state change to a next subsequent corresponding state change, such as from a state change of off to on until the next state change of off to on.

Each flip-flop in the corrector chain 102 is configured to sequentially impart a delay to a signal moving through the flip-flops based on the internal signal received by the flip-flop of the plurality of internal signals. The delay selection logic elements 108 act to define the end of the delay period by selecting the output of one of the flip-flops based on the division value. As described above, in one or more embodiments, this may be achieved by the delay selection logic elements 108 receiving one or more division values of the division factor and causing the desired one of the delay selection logic elements 108 to provide an output signal based on both those division values and the receipt of a suitable state change of the flip-flops to which that logic element is coupled. In the case of a plurality of sub-chains 502A, 502B, 502N, this process may occur once for each sub-chain 102A, 102B, 102N such that a signal is selected for a first sub-chain 102A before the signal starts to move through the second sub-chain 102B wherein a signal is selected for that sub-chain 102B and so on until the final sub-chain 102N in the corrector chain 102 provides a corrector chain output signal. In one or more embodiments then, the second state change in the output signal of the duty cycle correction circuit 100 may be triggered by the output signal of the corrector chain 102 being provided at least to a reset terminal of the flip-flop that triggered the first state change of the output signal, thereby returning the state of the output signal of the duty cycle correction circuit 100 to its original value. This may be implemented by causing the first flip-flop 107 in the corrector chain 100 to reset its output signal to logic low on receipt of the output signal 114 of the corrector chain 102 at its reset terminal 106, thereby causing the output signal 110 of the duty cycle correction circuit 100 to change to a logic low state. In this way, a change in state of the output signal 114 of the corrector chain 102 may cause the second state change of the output signal 110 of the duty cycle corrector circuit 100.

Figure 2:
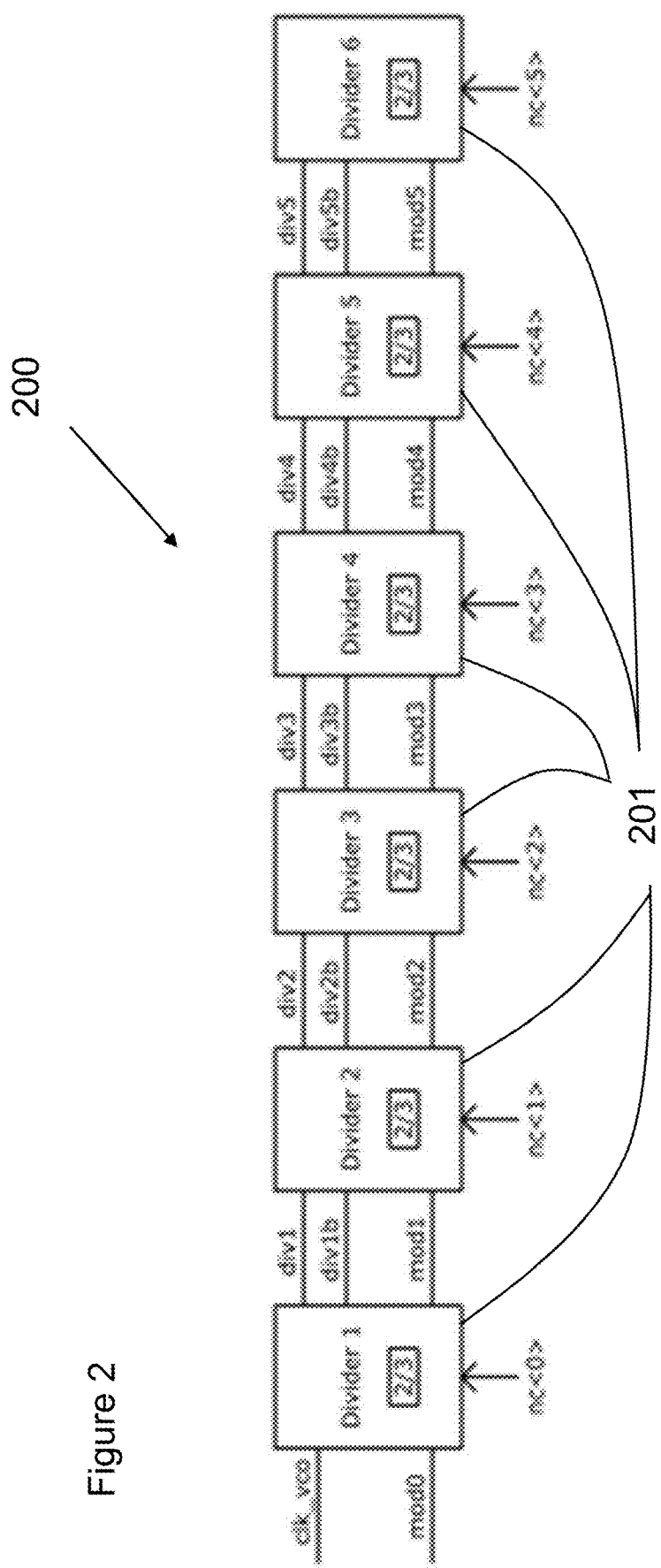
FIG. 2 shows an example multi-modulus frequency divider comprising a chain of divide by ⅔ prescalers.

FIG. 2 shows an example embodiment of a multi-modulus frequency divider 200. The multi-modulus frequency divider 200 comprises a plurality of divide by ⅔ prescalers 201 arranged in a chain such that, apart from for the first prescaler 201 in the chain, an input of each divide by ⅔ prescaler 201 is coupled to an output of the preceding divide by ⅔ prescaler 201. The first divide by ⅔ prescaler 201 in the chain may receive its input signal from the output of a device that needs a signal to be frequency divided, such as receiving the output of a voltage-controlled oscillator (VCO) of a phase-locked loop (PLL) circuit. Each divide by ⅔ prescaler 201 in the chain may provide a set of signals that are internal to the multi-modulus frequency divider 200 to the corrector chain 102 of the duty cycle correction circuit 100. In other embodiments, only a sub-set of the prescalers 201 may provide one or more internal signals 101 to the corrector chain 102.

The first divide by ⅔ prescaler 201 in the multi-modulus frequency divider 200 may be configured to receive an input signal (clk_vco) for being divided at a first input terminal and a modulus signal (mod0) at a second input terminal. The modulus signals are internal signals used in order to ensure that the division by 3 will happen only one time per division cycle. A division value signal (nc<x>) and a modulus signal both at high value are necessary conditions to cause the divide by ⅔ prescaler to perform a division by 3. The first divide by ⅔ prescaler 201 further receives a division value (nc<0>) at a control terminal. The digital state of the division value received by the divide by ⅔ prescaler 201 controls whether the first division during a particular division cycle causes the input signal to be divided by 2 or divided by 3. ⅔ prescalers offer the possibility to reach a division range between $2^N$ and $2^{N+1}-1$ if they are used as a chain arrangement where N is the number of dividers in the chain (like in a multi-modulus frequency divider). Each of the input signals provided to the first divide by ⅔ prescaler 201 may be considered to be internal signals of that divide by ⅔ prescaler 201 and of the multi-modulus frequency divider 200 as a whole.

The first divide by ⅔ prescaler 201 may provide a first output signal which is the input signal (div1) received at the first terminal of the second divide by ⅔ prescaler 201, wherein that signal has been divided in frequency by either 2 or 3 based on the modulus signal (mod0) and the division value (nc<0>) of the first divide by ⅔ prescaler 201. The first divide by ⅔ prescaler 201 may further provide a second output signal (div1b) which is the inverse of the first output signal (div1), i.e., a signal wherein, when the first output signal (div1) is in a logic state high, the second output signal (div1b) is in a logic state low and vice versa. Finally, the divide by ⅔ prescaler 201 may provide a third output signal (mod1) which is a further modulus signal. Each modulus signal has a frequency equal to the multi-modulus frequency divider output frequency. The first modulus signal (mod0) is generated before the first divide by ⅔ prescaler and travels down the chain. The modulus signal is fixed to ensure that each prescaler divides by 3 only once each division cycle at maximum. Each of the first (div1), second (div1b) and third (mod1) output signals of the first divide by ⅔ prescaler 201 are provided to the second divide by ⅔ prescaler 201 as its input signals and the second divide by ⅔ prescaler will further receive a division value (nc<1>), which might be the second "letter" in a digital word, for controlling whether the first division of the second divide by ⅔ prescaler is a division by 2 or a division by 3. Each divide by ⅔ prescaler 201 in the multi-modulus frequency divider 200 will then receive the outputs of its predecessor as its inputs.

Each of the signals received by, and output by, any of the divide by ⅔ prescalers 201 is an internal signal 101 of the multi-modulus frequency divider 200. Each of the signals received by, and output by, one of the divide by ⅔ prescalers may be considered to be an internal signal of that divide by ⅔ prescaler.

Figure 3:
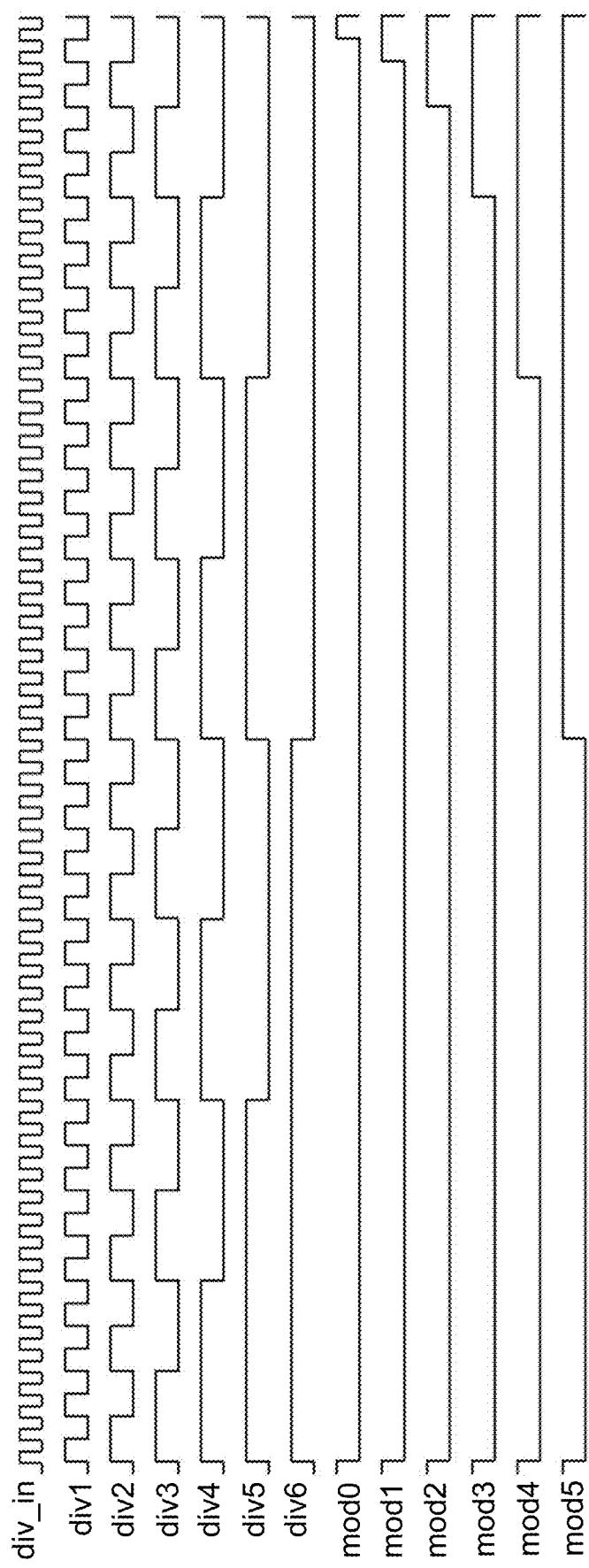
FIG. 3 shows a plurality of internal signals of an example multi-modulus frequency divider having a division factor of 000000.

FIG. 3 shows an example embodiment of the signals of the multi-modulus frequency divider 200 of FIG. 2 where the division value received by each divide by ⅔ prescaler 201 is equal to 0 and, as such, the division factor is 000000 because the multi-modulus frequency divider 200 has six divide by ⅔ prescalers 201. It will be appreciated that the multi-modulus frequency divider 200 may have any number of divide by ⅔ prescalers 201. Providing a division value of 0 to each of the prescalers 201 causes all of the divisions during a division cycle in each prescaler 201 to be divisions by 2. As such, the first output signal (div1) of the first divide by ⅔ prescaler 201 comprises a digital signal having an output frequency that is half of the frequency of its input signal (clk_vco), which may be an input from a VCO of a PLL. The first output signal (div2) of the second divide by ⅔ prescaler 201 then has half the frequency of the output signal (div1) of the first divide by ⅔ prescaler 201 and so on until the output frequency of the sixth divide by ⅔ prescaler has only a single digital waveform over the division period. It can also be seen in FIG. 6 how the modulus signals (mod0, mod1, mod2, mod3, mod4, mod5) change as they are output from each divide by ⅔ prescaler 201 in turn.

Figure 4:
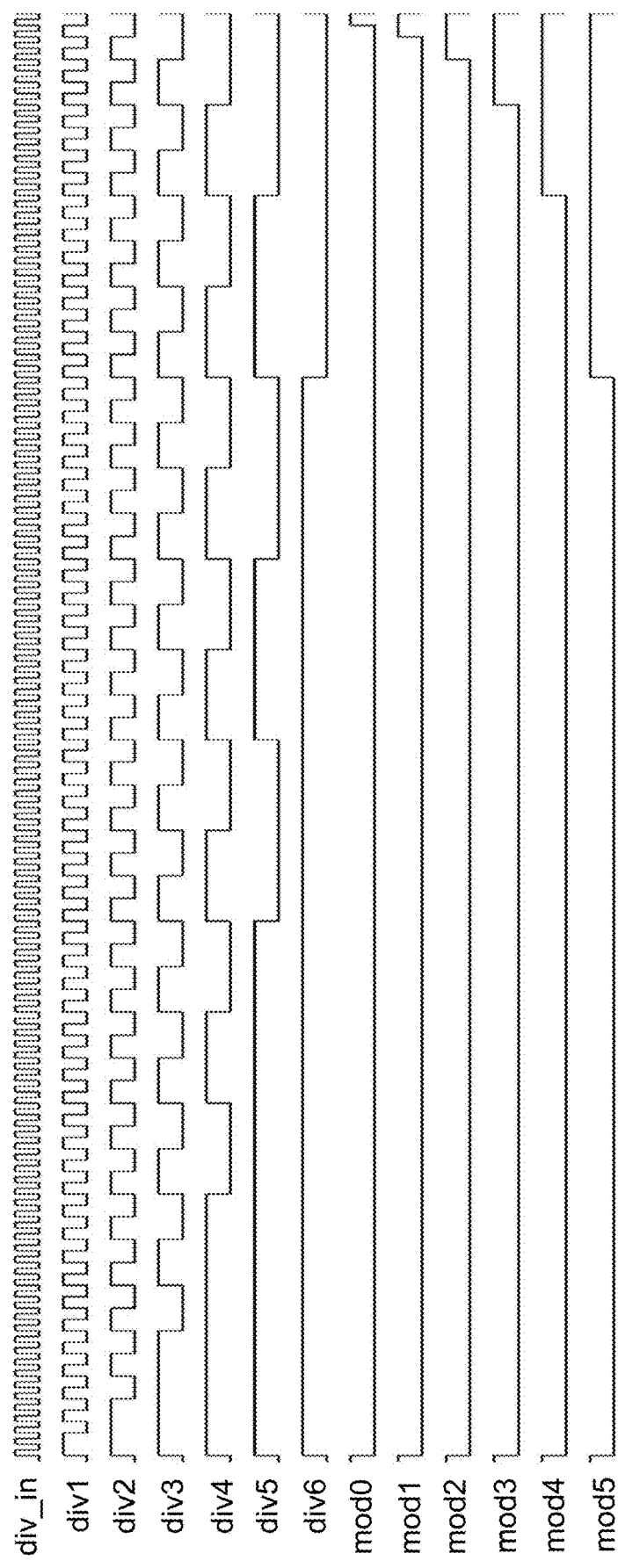
FIG. 4 shows a plurality of internal signals of an example multi-modulus frequency divider having a division factor of 111111.

FIG. 4 shows an example embodiment of the signals of the multi-modulus frequency divider 200 of FIG. 2 where the division value received by each divide by ⅔ prescaler 201 is equal to 1 and, as such, the division factor is 111111 because the multi-modulus frequency divider 200 has six divide by ⅔ prescalers 201. Providing a division value of 1 to each of the prescalers 201 causes the first division of each division cycle to be a division by 3. As such, it can be seen that the time spent in logic state 1 of the first output signal of the second divide by ⅔ prescaler (div2) is equal to three periods of the div1 signal during its first division cycle. After this, it is equal to two periods of the div1 signal for its remaining division cycles. The same is true for the output signals (div2, div3, div4, div5, div6) of each of the other divide by ⅔ prescalers. For the sixth divide by ⅔ prescaler 201, this means that, again, the output signal (div6) has only a single digital waveform over the division period at a duty cycle of close to 75%. As can be seen, the remainder of the divisions of each divide by ⅔ prescaler 201 are divisions by 2 where the frequency has been divided by two as compared to the output of the immediately preceding divide by ⅔ prescaler 201. Once more, it can be seen in FIG. 4 how the modulus signals of the divide by ⅔ prescalers 201 change.

In one or more embodiments, the transition to a second logic state of one of the plurality of internal signals 101 that causes the second state change of the output signal of the duty cycle correction circuit 100 may be a transition to a second logic state of an internal signal 101 derived from a prescaler 201 preceding the selected prescaler 201 in the multi-modulus frequency divider 200. Because each of the first and second output signals of each divide by ⅔ prescaler 201 has a lower frequency than the corresponding outputs of a preceding prescaler 201, then starting with and primarily using frequencies from prescalers 201 later in the multi-modulus frequency divider 200 reduces the current consumption of the duty cycle correction circuit 100. Referring to FIGS. 3 and 4, it can be seen that it may not be difficult to reach a desired duty cycle by relying on internal signals 101 from early in the multi-modulus frequency divider 200 (those from the first few divide by ⅔ prescalers 201) because there are so many rising and falling edges in the high frequency signals that one could select whichever edge is closest to 50% in order to trigger the second state change of the output signal of the duty cycle correction circuit 100. Such an approach, however, may result in high current consumption because using higher frequency signals consumes more current than using lower frequency signals. In order to maintain a lower current consumption, while still reaching a desired duty cycle, or reaching within an acceptable margin of error of a desired duty cycle, lower frequency signals may be used for setting at least part of the delay period. Defining the first state change of the output signal of the duty cycle correction circuit using signals from a selected divide by ⅔ prescaler 201 allows for consuming relatively low currents. Subsequently using higher frequency internal signals 101 from divide by ⅔ prescalers 201 preceding the selected divide by ⅔ prescaler 201 in the chain may allow for using a rising or falling edge from an internal signal 101 of a higher frequency signal for defining the second state change of the output signal of the duty cycle correction circuit 100.

In the case where a plurality of sub-chains 102A, 102B, 102N within the corrector chain 102 are used, each sub-chain may use internal signals from a single one of the divide by ⅔ prescalers 201 of the multi-modulus frequency divider 200. In such embodiments, the final sub-chain 102N may use internal signals 101 from an earlier divide by ⅔ prescaler 201 in the chain than the those used by the first sub-chain 102A. In this way, the transition to a second logic state of the plurality of internal signals 101 that defines the second state change of the output signal of the duty cycle corrector circuit 100 may be derived from a prescaler 201 preceding the selected prescaler 201 in the chain of prescalers. In one or more embodiment, each sub-chain 102A, 102B, 102N in the corrector chain 102 may use internal signals 101 from a different divide by ⅔ prescaler 201. In one or more of these embodiments, the internal signals used by each sub-chain 102A, 102B, 102N may be from a preceding divide by ⅔ prescaler 201 in the multi-modulus frequency divider 200 as compared to internal signals used by the immediately preceding sub-chain. In this way, each sub-chain may use progressively higher frequency signals in order to hone-in on a desired duty cycle.

In one or more embodiments, the arrangement of at least the flip-flops and delay selection logic elements 108 may be such that the duty cycle of the output signal 110 of the duty cycle correction circuit 100 may be between 40-60%. In such embodiments, it may be ideal to reach a 50% duty cycle but values between 40-60% may be acceptable in order to maintain a low current consumption. In other embodiments, the duty cycle of the output signal 110 of the duty cycle correction circuit 100 may be between 45-55% or 48-52%. In yet other examples, the duty cycle of the output signal 110 of the duty cycle correction circuit 100 may be substantially equal to 50%. It will be appreciated that accurately reaching a duty cycle of substantially 50% may require a comparatively high current consumption compared to accepting a duty cycle between 40-60%. The trade-off between current consumption and duty cycle may be decided by a circuit designer and built into the functionality of the circuit 100 by way of the connections between the flip-flops, the logic elements 108, 112 and which internal signals 101 are received by the flip-flops. In yet other embodiments, one or more of the plurality of internal signals 101 provided to the flip-flops; the connections of the logic elements to the flip-flops; and the division value may be reconfigurable in order to make the delay period, and thereby the duty cycle, adjustable during operation.

In one or more embodiments where one or more of the plurality of internal signals 101 provided to the flip-flops; the connections of the logic elements 108, 112 to the flip-flops; and the division value are reconfigurable in order to allow for adjustment of the delay period during operation, the duty cycle correction circuit 100 may further comprise a memory configured to store a plurality of duty cycle profiles. The memory may be any suitable non-transient memory configured to store data thereon. The plurality of duty cycle profiles may contain information that defines each or a subset of the interconnection of internal signals 101, logic elements 108, 112 and the division value needed to provide one or both of a particular current consumption of the duty cycle correction circuit 100 and a particular duty cycle of the output signal 110 of the duty cycle correction circuit 100. As such, each duty cycle profile may comprise the information needed by the duty cycle correction circuit 100 to set any reconfigurable properties or connections in order to achieve a desired result. In such embodiments, the duty cycle correction circuit 100 may further comprise a controller configured to receive signalling indicative of a user selection of one or both of a desired current consumption and a desired duty cycle. The controller may be configured to receive these indications from any suitable user input means such as from a keyboard, a touch screen, a mouse input, voice recognition, or any other suitable input means. The signalling from the user input device may originate from a device exterior to the duty cycle correction circuit 100. The indication of a desired current consumption may define a maximum desired current consumption, a target desired current consumption or a minimum desired current consumption for the duty cycle correction circuit. Similarly, the desired duty cycle may be a maximum desired duty cycle, a target desired duty cycle or a minimum desired duty cycle. The desired duty cycle may also comprise information indicative of a degree of error which may be acceptable relative to the target duty cycle. For example, the acceptable degree of error may be 10%, 5% or 2% away from a target duty cycle, such as a target duty cycle of 50%. The controller may further be configured to control a parameter of the duty cycle correction circuit 100 that provides for control of the delay period. For example, the controller may be configured to control any one or more of the internal signals 101 provided to the flip-flops of the corrector chain 102; the connections of the logic elements 108, 112, including the flip-flops to which they are connected; and the division factor. The controller may be configured to select a duty cycle profile based on the received signalling and control the adjustable parameters of the duty cycle correction circuit 100 according to the duty cycle profile in order to achieve one or both of the desired current consumption and desired duty cycle. In some situations, a duty cycle profile may not exist for the received desired duty cycle or desired current consumption, in one or more embodiments, in such situations, the controller may be configured to select a duty cycle profile that is closest to the desired one or both of the current consumption and duty cycle. It will be appreciated that a wide variety of approaches may be available for making the parameters and connections reconfigurable, as described above. For example, a plurality of switches or multiplexers that are controllable by the controller may provide the reconfigurability required or any other suitable approach may be used.

Figure 5:
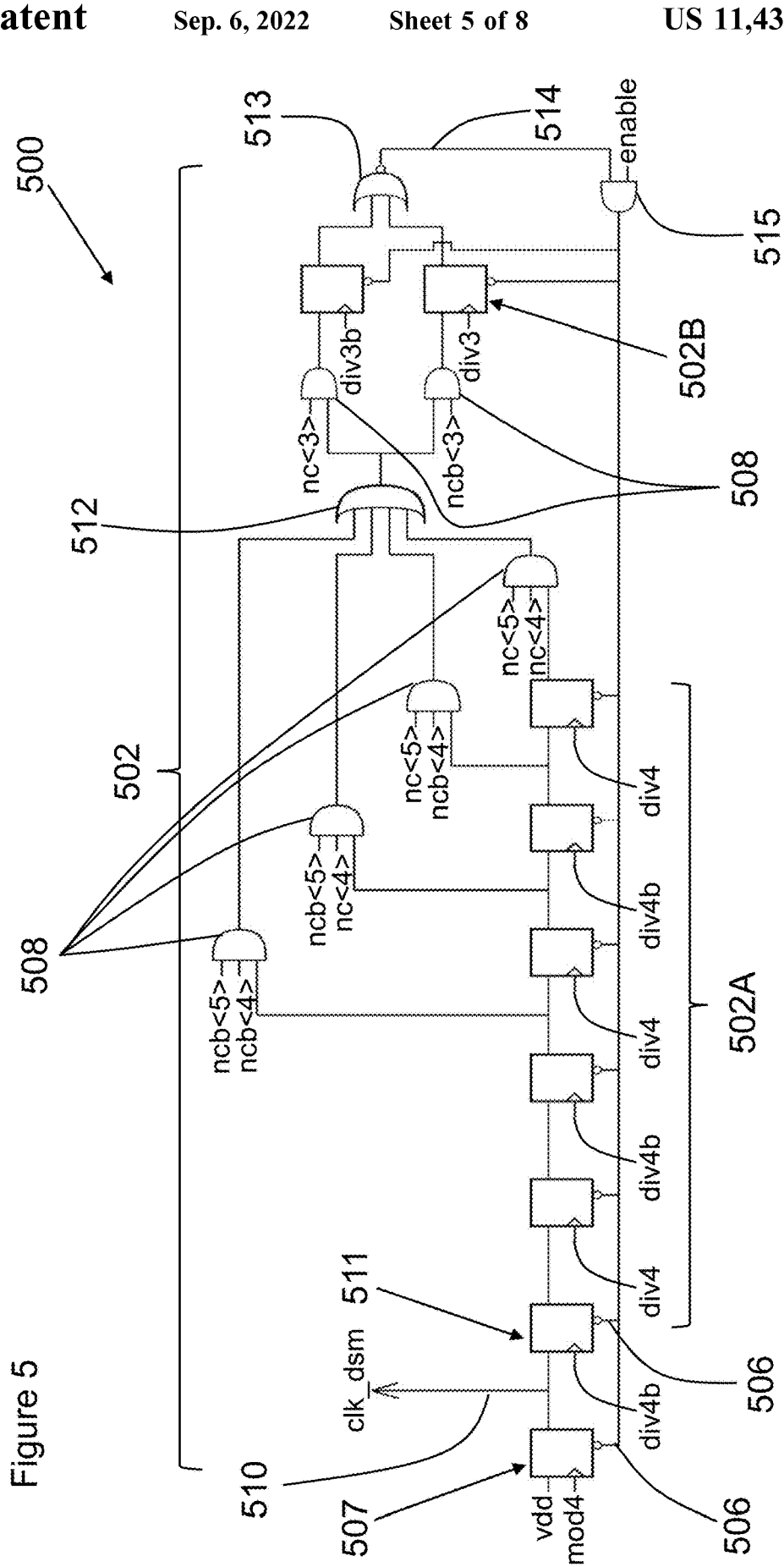
FIG. 5 shows a specific example of a duty cycle correction circuit.

FIG. 5 shows a specific example embodiment of the duty cycle correction circuit 500. This duty cycle correction circuit 500 comprises a corrector chain 502 that comprises two sub-chains 502A, 502B of flip-flops wherein the first sub-chain comprises six flip-flops and the second sub-chain 502B comprises a first branch comprising a single flip-flop and a second branch comprising a single flip-flop. In addition to the first two sub-chains of flip-flops, a first flip-flop 507 of the duty cycle correction circuit 500 is configured to define the first state change of the output signal 510 of the duty cycle correction circuit 500. The output signal 510 of the duty cycle correction circuit 500 is provided after the first flip-flop 507 of the duty cycle correction circuit 500 and before the input of the first flip-flop 511 in the first sub-chain 502A.

Delay selection logic elements 508 are coupled to the outputs of four of the flip-flops in the first sub-chain 502A, where each delay selection logic element 508 is an AND gate 508 having three input terminals such each AND gate 508 will provide an output at logic state high only if the input at each input terminal is at logic state high. In this example, one input terminal of each AND gate 508 receives an output signal of one of the flip-flops and the other two input terminals receive either two of the division values of the division factor or the inverse of two of the division values. That is, nc<4> may refer to the AND gate 508 receiving a logic high input when the fourth letter of the division factor is equal to 1 and ncb<4> may refer to the AND gate 508 receiving a logic high input when the fourth letter of the division factor is equal to 0. The corresponding inputs for the AND gate 508 are received with respect to nc<5> and ncb<5> for the fifth letter in the division factor, that is, the fifth digital value in the digital word of the division factor. The outputs of each of the delay selection logic elements 508 are coupled to a chain connector logic element 512 which, in this embodiment, is an OR gate 512. The chain connector logic element 512 serves to ensure that only a single output signal is provided to the second sub-chain 502B irrespective of any changes to the division factor.

Further delay selection logic elements 508 are coupled to the second sub-chain 502B and, in this case, the delay selection logic elements 508 are instead coupled to the input of the flip-flops of the second sub-chain 502B such that the output of the delay selection logic elements 508 are provided to the flip-flops of the second sub-chain and each delay selection logic element 508 receives the output of the chain connector logic element 512 at a first input terminal and one of the division values at a second input terminal. In this case, the delay selection logic elements 508 still act to select which flip-flop of the two parallel flip-flops provides an output signal to the final logic element 513 in the sub-chain 502B which may also be considered as a chain connector logic element, the output of which provides the output signal 514 of the corrector chain 502.

In this example, the final logic element 513 of the corrector chain 502 is a NOR gate which is configured to provide an output signal 514 equal to logic high when under any condition except when both of its input terminals receive a logic low signal, under which conditions it provides an output of logic low. The output terminal of the final logic element 513 of the corrector chain 502 may be coupled to the reset terminals 506 of each of the flip-flops in the corrector chain 502. In one or more embodiments, and as shown in FIG. 5, the output of the final logic element 513 of the corrector chain 502 may be coupled to the reset terminals 506 of the flip-flops via a feedback logic element 515 which is configured to enable or disable the ability to reset the flip-flops by way of an enable input terminal such that a logic state high reset signal can only be passed to the reset terminals 506 of the flip flops if the enable signal is at logic state high. The feedback logic element may also be used to force a reset of all of the flip-flops by setting the enable signal to a logic low state. It will be appreciated that other logic elements may be used in place of the AND gate used in this example for the feedback logic element 515. In the example of FIG. 5, all of the flip-flops have an active low reset terminal 506 such that the flip-flop will reset upon receipt of a logic low signal rather than upon receipt of a logic high signal. Upon reset of the first flip-flop of the corrector chain 502, the output signal 510 of the duty cycle correction circuit 500 will be set, in this example, to logic state low, that is, resetting the flip-flops causes the second state change of the output signal 510 of the duty cycle correction circuit 500. It will be appreciated that the type of terminal used for the reset terminals 506 and the type of logic elements 508, 512, 513 used through the corrector chain 502 is a design choice and that any suitable terminals or logic elements may be used to achieve the functionality described here.

Figure 6:
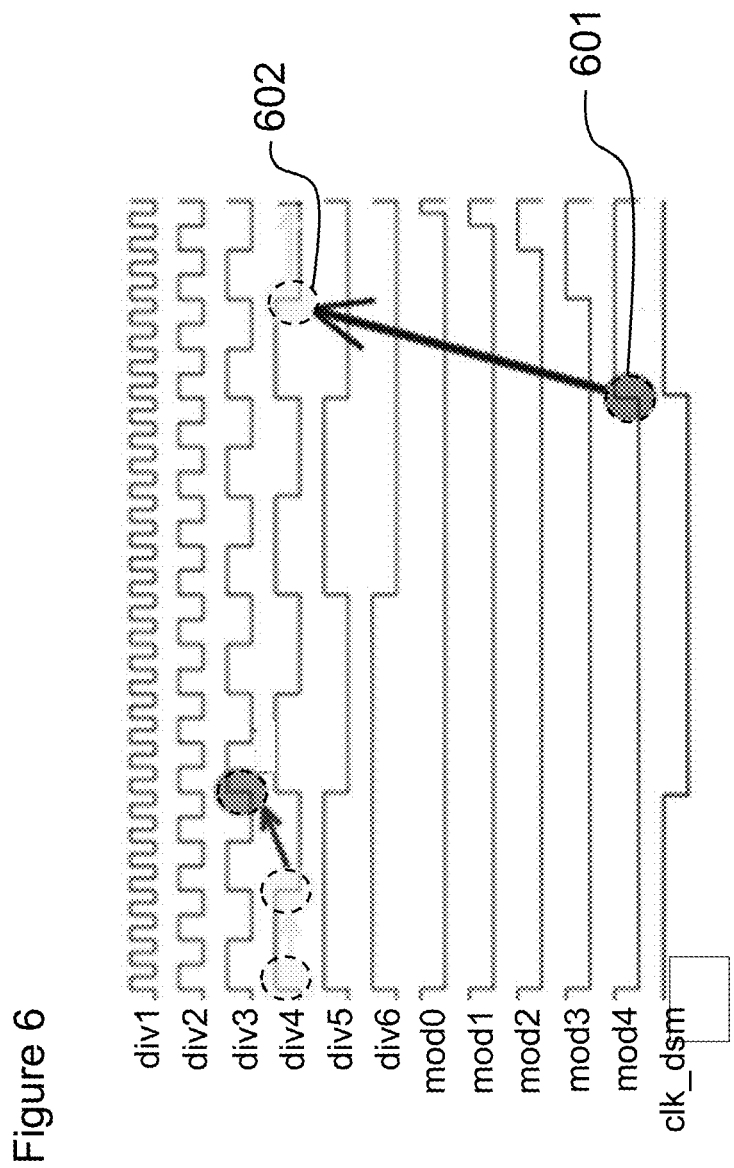
FIG. 6 shows a plurality of internal signals of the multi-modulus frequency divider of FIG. 5 using a division factor of 000000
Figure 7:
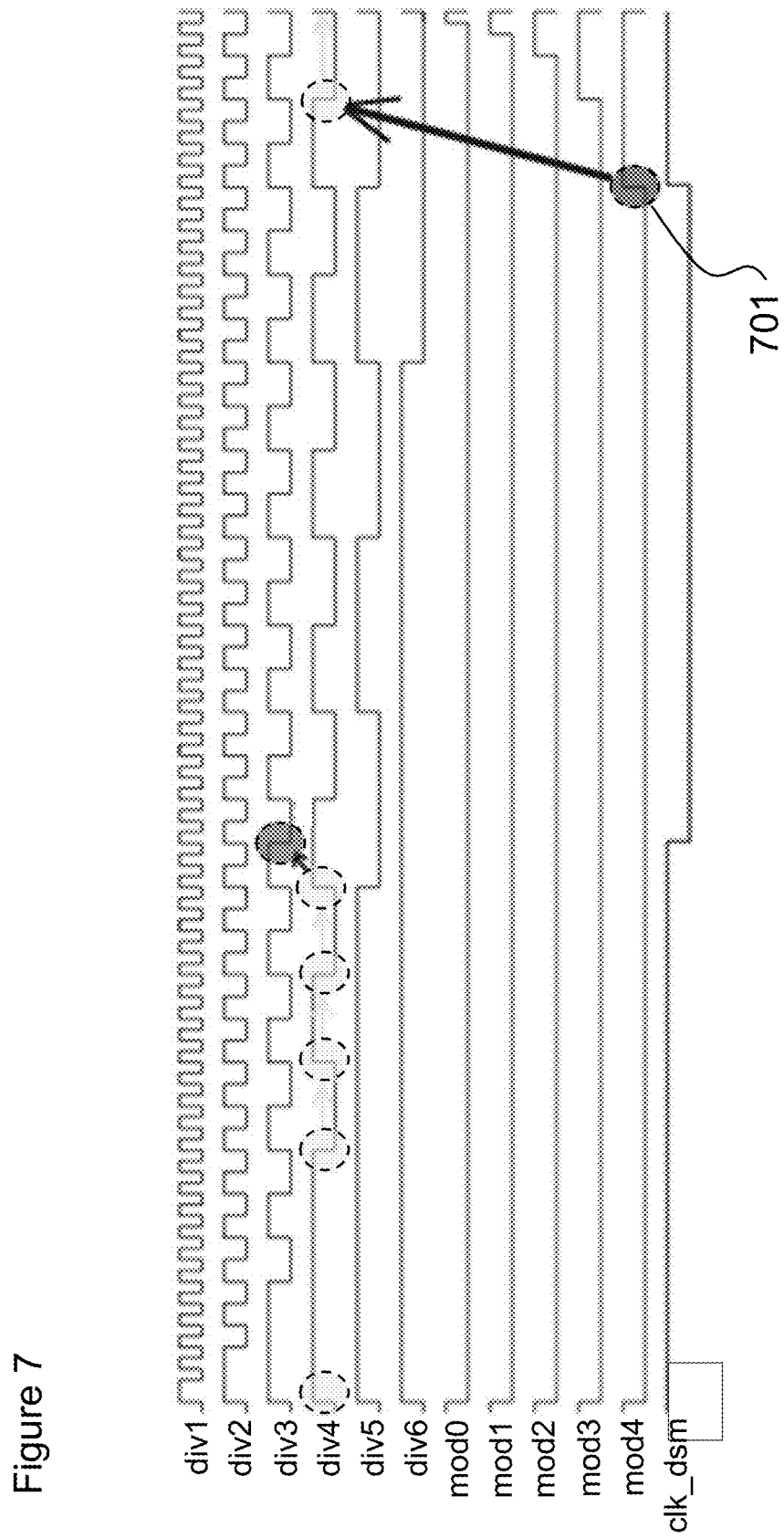
FIG. 7 shows a plurality of internal signals of the multi-modulus frequency divider of FIG. 5 using a division factor of 111111.

FIGS. 6 and 7 show signal timing diagrams for the signals of a multi-modulus frequency divider having six divide by ⅔ prescalers arranged in a chain. In FIG. 6, an example is shown where the division factor is 000000 and in FIG. 7, an example is shown where the division factor is 111111. These timing diagrams schematically show which of the internal signals of the multi-modulus frequency divider are used by the same corrector chain in order to provide different output signals of the duty cycle frequency divider in the case of each division value.

For the case of a division factor of 000000 and looking to FIG. 5, it can be seen that the first flip-flop in the corrector chain receives an input of mod4 in order to trigger the first state change of the output signal of the duty cycle correction circuit. This also starts a signal moving through the corrector chain. The rising edge 601 of modulus signal 4 (mod4) is highlighted in FIG. 6 as the signal which starts the off the duty cycle correction circuit. The output signal of the first flip-flop is then provided to the input of first flip-flop 511 in the first sub-chain 502A and an output from that flip-flop 511 is not provided until the receipt of a falling edge of the fourth divide by ⅔ prescaler, as represented in FIG. 5 by the input terminal receiving a signal div4b. This falling edge 602 is represented and highlighted in FIG. 6. Upon receipt of falling edge 602, the flip-flop 511 provides an output signal, thereby providing a delay as shown in FIG. 6. Correspondingly, the following two flip-flops in the first sub-chain 503A wait for a following rising edge, represented by div4, and a further falling edge, represented again by div4b. Each of these edges are represented in the timing diagram at the beginning of the diagram. It will be appreciated that the timing diagrams provided herein represent repeating patterns. The output of the third flip-flop in the first sub-chain 502A of the corrector chain 502 is coupled to a delay selection element 508. This delay selection element receives the inverse of the division value at two of its inputs and, as such, will provide an output signal where the fourth and fifth division values of the division factor are at logic low, or equal to logic 0. Since we are considering the case where the division factor is equal to 000000, this delay selection element provides a logic high output upon receiving a logic high output of the third flip-flop of the first sub-chain 502A and, response, sends a logic high signal to the chain connector logic element 512, which in turn passes a logic high signal to the second sub-chain 502B. Since each of the other delay selection logic elements are configured to provide a logic high output at different combinations of the values of the division factor, none of these logic elements will provide an output signal unless the division factor changes. Upon receipt of a logic high input from one of the delay selection logic elements, the chain connector logic element provides a logic high signal to the delay selection elements 508 of the second sub-chain. Once more, these delay selection elements 508 are controlled by the division factor and, in this case, by the value of the third division value of the division factor. Since the third division value is equal to 0, the lower delay selection logic element will provide a logic high value and, as such, the flip-flop of the lower parallel chain will then provide an output signal upon receipt of the next rising edge of the output signal of the third divide by ⅔ prescaler. This is the final flip-flop in the corrector chain 502 and, as such, this transition to a logic high state causes the output of the reset signal to all of the flip-flops, there by inducing the second state change of the output signal of the duty cycle correction circuit 500. This can be seen in FIG. 6 where the next rising edge after the preceding falling edge of the output of the fourth divide by ⅔ prescaler is used to trigger the transition to logic state zero of the output signal of the duty cycle corrector circuit, which is represented in FIG. 6 by signal clk_dsm. The duty cycle correction circuit of FIG. 5 is configured to provide an output signal having a duty cycle of close to 50% and this is achieved, as shown in FIG. 6.

FIG. 7 shows the timing diagram for the case where the division factor is equal to 111111. The same analysis can be performed on FIG. 5 now and, in this case, it can be seen that it is the final delay selection logic element in the first sub-chain which provides a logic high when the fourth and fifth division values are equal to logic 1. As such, the signal is not passed to the second division chain until a longer delay has taken place as compared to the case for a division factor of 000000. This lines up with FIG. 7 where the system waits for a total of six rising and falling edges of the output signal of the fourth divide by ⅔ prescaler prior to then taking the following falling edge of the output signal of the third divide by ⅔ prescaler. The use of the falling edge of the third divide by ⅔ prescaler can be seen in FIG. 5 where the upper delay selection logic element 508 provides an output signal because the third letter of the division factor (nc<3>) is equal to 1 and, as such, the following flip-flop provides an output signal at the next falling edge as a result of the receipt of the div3b signal. Overall, this provides an output signal of clk_dsm in FIG. 7 of close to 50%.

Figure 8:
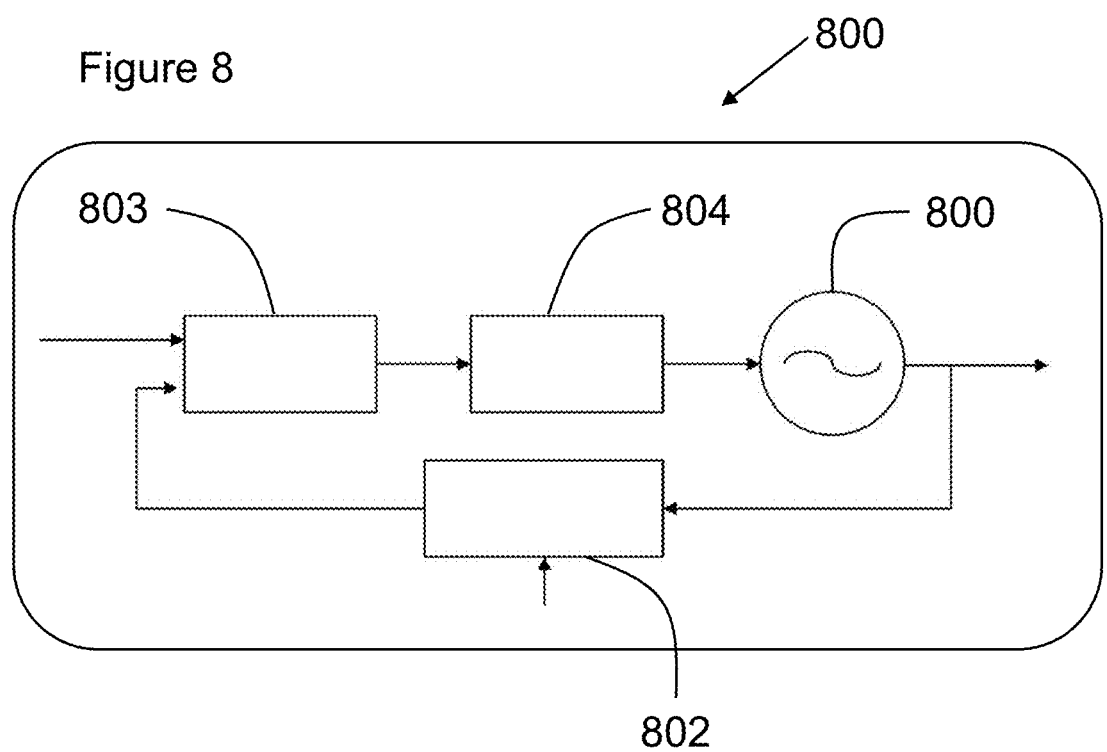
FIG. 8 shows a PLL comprising a duty cycle correction circuit.

FIG. 8 shows an example embodiment of a phase-locked loop 800 circuit comprising a voltage-controlled oscillator 801, a duty cycle correction circuit and multi-modulus frequency divider 802, a phase detector 803 and a low pass filter 804. It will be appreciated that this provides a simplified example of a phase locked loop and that additional components may be used in the circuit.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A duty cycle correction circuit for a multi-modulus frequency divider, the multi-modulus frequency divider comprising a chain of divide by ⅔ prescalers wherein a division factor defines a mode of operation of each of the divide by ⅔ prescalers and wherein the duty cycle correction circuit is configured to provide an output signal based on: a plurality of internal signals comprising frequency divided signals received from the multi-modulus frequency divider; and the division factor, the duty cycle correction circuit comprising:
a corrector chain comprising a plurality of flip-flops, each flip-flop configured to receive a respective one of the plurality of internal signals from the multi-modulus frequency divider; and
at least one delay selection logic element, the or each delay selection logic element configured to receive an output signal from different ones of the flip-flops and the output of each delay selection logic element is based on the received output signal from the one of the flip flops and the division factor;
wherein the duty cycle correction circuit is configured such that:
a first state change in the output signal of the duty cycle correction circuit is defined by a transition to a first logic state of one of the plurality of internal signals received from a selected prescaler of the multi-modulus frequency divider; and
a second state change in the output signal of the duty cycle correction circuit is based on a transition to a second logic state of one of the plurality of internal signals after a delay period, wherein the duty cycle of the output signal is based on the delay period and wherein each flip-flop in the corrector chain sequentially imparts a delay to a signal moving through the flip flops in the corrector chain based on the internal signal received by the flip-flop of the plurality of internal signals, wherein the delay period comprises the sum of the delays imparted by the flip-flops and wherein the delay selection logic elements are configured such that they define the end of the delay period by selecting the output of one of the flip-flops based on the division factor.

2. The duty cycle correction circuit of claim 1 further comprising the multi-modulus frequency divider comprising the chain of divide by ⅔ prescalers and wherein the multi-modulus frequency divider is configured to provide the plurality of internal signals to the duty cycle correction circuit.

3. The duty cycle correction circuit of claim 1 wherein the transition to a second logic state of one of the plurality of internal signals is a transition to a second logic state of a signal derived from a prescaler preceding the selected prescaler in the chain of prescalers.

4. The duty cycle correction circuit of claim 1 wherein each of the flip-flops in the corrector chain is configured to provide an output signal based on the receipt of:
- a signal in a first logic state from a preceding flip-flop in the corrector chain; and
- a state change of the internal signal received by the flip-flop from the plurality of internal signals, such that each flip-flop in the chain of flip-flops adds to the delay period.

5. The duty cycle correction circuit of claim 3 wherein the corrector chain comprises a first sub-chain comprising one or more flip-flops that is configured to impart a first sub-delay based on the internal signals received from the selected divide by ⅔ prescaler and a second sub-chain comprising one or more flip-flops configured to impart a second sub-delay based on the internal signals received from a second divide by ⅔ prescaler wherein the second divide by ⅔ prescaler precedes the selected divide by ⅔ prescaler in the chain of divide by ⅔ prescalers, wherein the first sub-chain is separated from the second sub-delay chain by a chain connector logic element and wherein the delay period is comprised of the first sub-delay and the second sub-delay.

6. The duty cycle correction circuit of claim 1 wherein the arrangement of flip-flops and delay selection logic elements is such that the duty cycle of the output signal of the duty cycle correction circuit is between 40-60%.

7. The duty cycle correction circuit of claim 1 wherein the arrangement of flip-flops and delay selection logic elements is such that the duty cycle of the output signal of the duty cycle correction circuit is between 45-55%.

8. The duty cycle correction circuit of claim 1 wherein the arrangement of flip-flops and delay selection logic elements is such that the duty cycle of the output signal of the duty cycle correction circuit is between 48-52%.

9. The duty cycle correction circuit of claim 1 wherein the arrangement of flip-flops and delay selection logic elements is such that the duty cycle of the output signal of the duty cycle correction circuit is substantially 50%.

10. The duty cycle correction circuit of claim 2 wherein:
- the first divide by ⅔ prescaler in the chain of divide by ⅔ prescalers is configured to receive a digital input signal and provide an output signal based on the digital input signal and the division factor; and
- each subsequent divide by ⅔ prescaler in the chain of divide by ⅔ prescalers is configured to receive an output signal of a preceding prescaler in the chain of divide by ⅔ prescalers and wherein the output of each subsequent divide by ⅔ prescaler is based on the output signal of the preceding prescaler and the division factor.

11. The duty cycle correction circuit of claim 1 wherein the division factor is a digital word comprising a plurality of division values and wherein each division value is a digital value and is provided to a different one of the divide by ⅔ prescalers to control whether the prescaler is operating in a divide-by-2 mode or a divide-by-3 mode and wherein each delay selection logic element of the duty cycle correction circuit is configured to receive at least one of the division values and the delay selection logic elements are configured to control the delay period by selecting which flip-flop output signal in the chain of flip flops to use for triggering the second state change in the output signal of the duty cycle correction circuit.

12. The duty cycle correction circuit of claim 1 wherein a change of state in an output signal of the corrector chain, which is based on the transition to a second logic state of one of the plurality of internal signals, causes the second state change of the output signal of the duty cycle correction circuit.

13. The duty cycle correction circuit of claim 1 wherein one or more of: the plurality of internal signals provided to the flip-flops; the connections of the delay selection logic elements; and the division factor are reconfigurable such that the delay period is adjustable.

14. The duty cycle correction circuit of claim 13 further comprising:
- a memory that stores a plurality of duty cycle profiles, each duty cycle profile defining the interconnection of signals, delay selection logic elements and the division factor needed to provide a different current consumption of the duty cycle correction circuit and duty cycle of the output signal of the duty cycle correction circuit; and
- a controller configured to receive signalling indicative of a user selection of one or both of a desired current consumption and a desired duty cycle and the controller further configured to control one or more of:
  - the internal signals provided to the flip-flops;
  - the connections of the delay selection logic elements; and
  - the division factor, wherein the controller is configured to select a duty cycle profile based on the received signalling and control the connection of the internal signals to the flip-flop, the connections of the delay selection logic elements and the division factor in order to achieved desired one or both of current consumption and duty cycle.

15. A phase locked loop comprising the duty cycle control circuit of claim 1.

* * * * *